United States Patent
Zmek et al.

(10) Patent No.: US 10,182,519 B2
(45) Date of Patent: Jan. 15, 2019

(54) DETERMINISTIC EMI GRID LAYOUT FOR CONTROLLING OPTICAL DIFFRACTION

(71) Applicant: Goodrich Corporation, Charlotte, NC (US)

(72) Inventors: William Paul Zmek, Bethlehem, CT (US); Steven Sumner Prince, Bethlehem, CT (US)

(73) Assignee: GOODRICH CORPORATION, Charlotte, NC (US)

(*) Notice: Subject to any disclaimer, the term of this patent is extended or adjusted under 35 U.S.C. 154(b) by 0 days.

(21) Appl. No.: 15/826,912

(22) Filed: Nov. 30, 2017

(65) Prior Publication Data

US 2018/0084683 A1  Mar. 22, 2018

Related U.S. Application Data

(62) Division of application No. 13/706,689, filed on Dec. 6, 2012, now Pat. No. 9,861,019.

(51) Int. Cl.
*H05K 9/00* (2006.01)

(52) U.S. Cl.
CPC .................... *H05K 9/0094* (2013.01)

(58) Field of Classification Search
CPC .................. H05K 9/0094; H05K 9/0054
See application file for complete search history.

(56) References Cited

U.S. PATENT DOCUMENTS

| | | |
|---|---|---|
| 4,772,760 A | 9/1988 | Graham |
| 4,932,755 A | 6/1990 | Holdridge et al. |
| 5,084,132 A | 1/1992 | Smith |
| 5,455,117 A | 10/1995 | Nagano et al. |
| 5,945,213 A * | 8/1999 | Nagaike .............. C23C 18/30 428/336 |
| 6,255,778 B1 | 7/2001 | Yoshikawa et al. |
| 2010/0180428 A1 | 7/2010 | Jones et al. |
| 2011/0043887 A1 | 2/2011 | Valentin et al. |
| 2014/0111365 A1 | 4/2014 | Liu et al. |
| 2014/0158417 A1 | 6/2014 | Zmek et al. |
| 2014/0240159 A1 | 8/2014 | Lawrence et al. |

* cited by examiner

*Primary Examiner* — Hung V Ngo
(74) *Attorney, Agent, or Firm* — Cantor Colburn LLP

(57) ABSTRACT

An electromagnetic interference shield is disclosed. The electromagnetic interference shield includes an optically transparent substrate and a metallic coating on the optically transparent substrate. The metal coating is characterized by a plurality of apertures aligned in a pattern that is defined by a deterministic relation. Distances between each of the plurality of apertures and an observation point in an associated image plane are uncorrelated.

9 Claims, 4 Drawing Sheets

DETERMINISTIC EMI GRID LAYOUT FOR CONTROLLING OPTICAL DIFFRACTION

CROSS REFERENCE TO RELATED APPLICATIONS

This application is a divisional of U.S. patent application Ser. No. 13/706,689, filed Dec. 6, 2012, the disclosure of which in incorporated by reference herein in its entirety.

BACKGROUND

The present disclosure relates to a metallic shield for reducing electromagnetic interference (EMI), and more specifically, to a metallic grid that additionally reduces diffractive effects at optical wavelengths.

Electromagnetic interference (EMI) is a disturbance to an electrical circuit due to electromagnetic radiation emitted from an external source. Protecting a circuit from EMI generally involves placing a metallic grid between the circuit and the external source. The metallic grid generally consists of a patterned metal coating applied to an optical substrate. In addition to protecting against EMI, the patterned metal coating is designed to allow transmission of optical wavelengths through the coating. In various implementations of a patterned EMI-reducing coating, the presence of the coating unavoidably reduces optical transmission, both by blocking light and by diffracting a portion of the transmitted light, resulting in signal loss and increased background illumination. In various applications, it may be useful to pass light (i.e., a designator beam) from a light source such as a laser through the metallic grid to identify an object. However, if the pattern of the grid is periodic, light passing through the grid may generate a diffractive scatter halo having side lobes, which are bright peaks of light appearing in the diffractive halo surrounding the desired (specular) beam. Additionally, the side lobes may fall on objects other than a target that is to be identified, giving rise to the possibility of a false positive identification. Therefore, there is a need to reduce the diffractive effects at optical wavelengths.

SUMMARY

According to one embodiment of the present disclosure, an electromagnetic interference shield includes an optically transparent substrate; a metallic coating on the optically transparent substrate, the metal coating characterized by a plurality of apertures aligned in a pattern that is defined by a deterministic relation, wherein distances between each of the plurality of apertures and an observation point in an associated image plane are uncorrelated.

According to another embodiment, a method of shielding an object from an electromagnetic signal includes: forming a metallic coating characterized by a plurality of apertures aligned in a pattern that is defined by a deterministic relation, wherein distances between each of the plurality of apertures and an observation point in an associated image plane are uncorrelated; and placing the metallic coating between the object and the electromagnetic signal.

According to another embodiment, a method of reducing diffraction effects in an electromagnetic interference shield, comprising: forming the electromagnetic interference shield using a metallic coating having a plurality of apertures aligned in a pattern that is defined by a deterministic relation, wherein distances between each of the plurality of apertures and an observation point in an associated image plane are uncorrelated.

Additional features and advantages are realized through the techniques of the present disclosure. Other embodiments and aspects of the disclosure are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

The subject matter which is regarded as the disclosure is particularly pointed out and distinctly claimed in the claims at the conclusion of the specification. The forgoing and other features, and advantages of the disclosure are apparent from the following detailed description taken in conjunction with the accompanying drawings in which:

DETAILED DESCRIPTION

Figure 1:
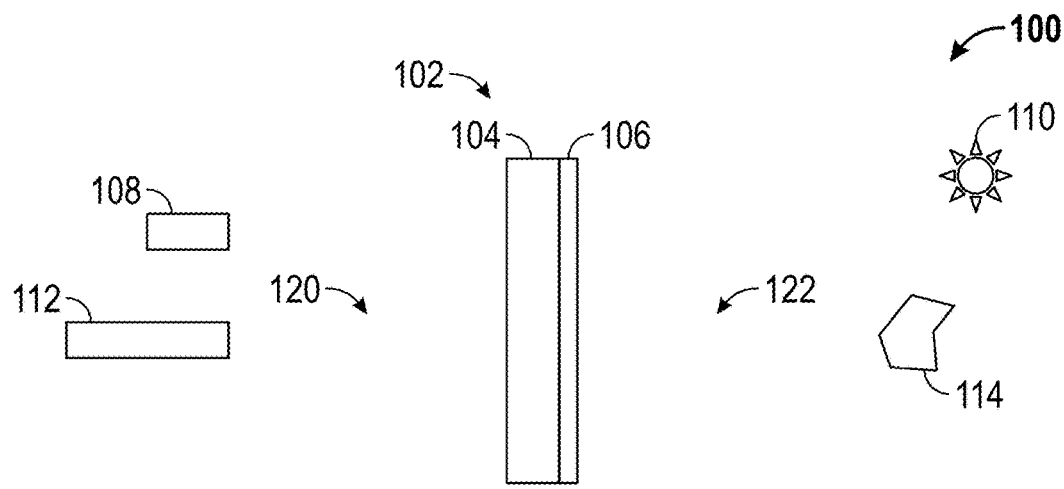
FIG. 1 shows an exemplary system that includes an electromagnetic interference (EMI) shield that reduces electromagnetic interference and allows passage of optical wavelengths.

FIG. 1 shows an exemplary system 100 that includes an electromagnetic interference (EMI) shield 102 that reduces electromagnetic interference and allows passage of optical wavelengths. The EMI shield 102 includes an optical substrate 104 and a metallic coating 106 formed on a surface of the optical substrate 104. The faces of the EMI grid 102 separate the surrounding space into an interior space 120 and an exterior space 122. In an exemplary embodiment, the EMI shield 102, including substrate 104 and metallic coating 106, is part of a larger contiguous structure that surrounds or envelopes the interior space 120 to form a Faraday cage. In various embodiments, the metallic coating 106 of the EMI shield 102 reduces penetration of EMI into the interior space 120 while allowing relatively free transmission of optical wavelengths. A sensor 108 is located in the interior space 120 so as to be protected from electromagnetic radiation from an electromagnetic source 110 in the exterior space 122. Additionally, a light source 112 such as a laser may be disposed in the interior space 120 and a target 114 may be located in the exterior space 122. The laser 112 may be used to shine a laser beam on the target. A reflection of the laser beam from the target 114 may be detected at sensor 108 in order to detect or identify the target. As discussed below, a pattern of the metallic coating 106 may affect the nature of the light that passes through the EMI shield 102. The present disclosure provides a pattern of a metallic coating 106 that allows protection from EMI while at the same time reducing an appearance of diffractive side lobes for light passing through the metallic coating 106. FIG. 2-5 discuss current coating patterns used in EMI shields.

Figure 2:
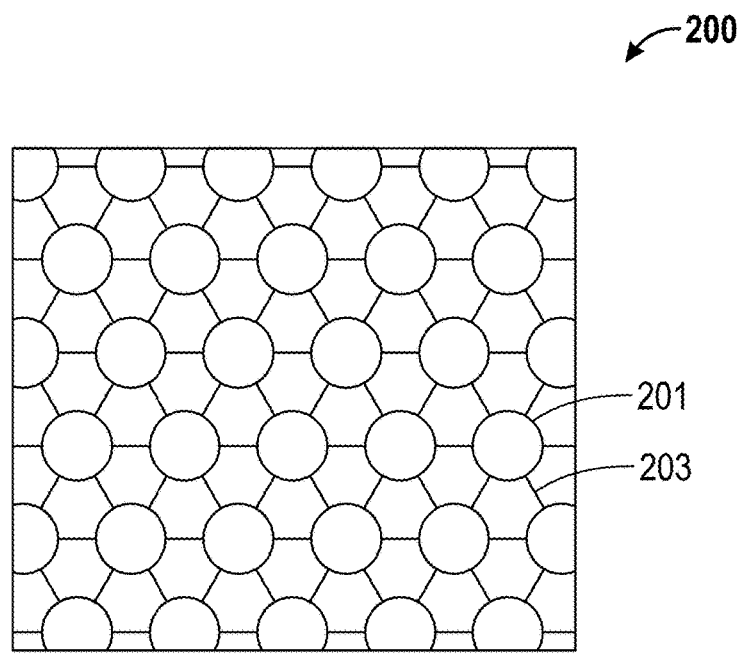
FIG. 2 (Prior Art) shows an exemplary pattern of a metallic coating that may be used to block electromagnetic interference in a conventional EMI shield.
Figure 3:
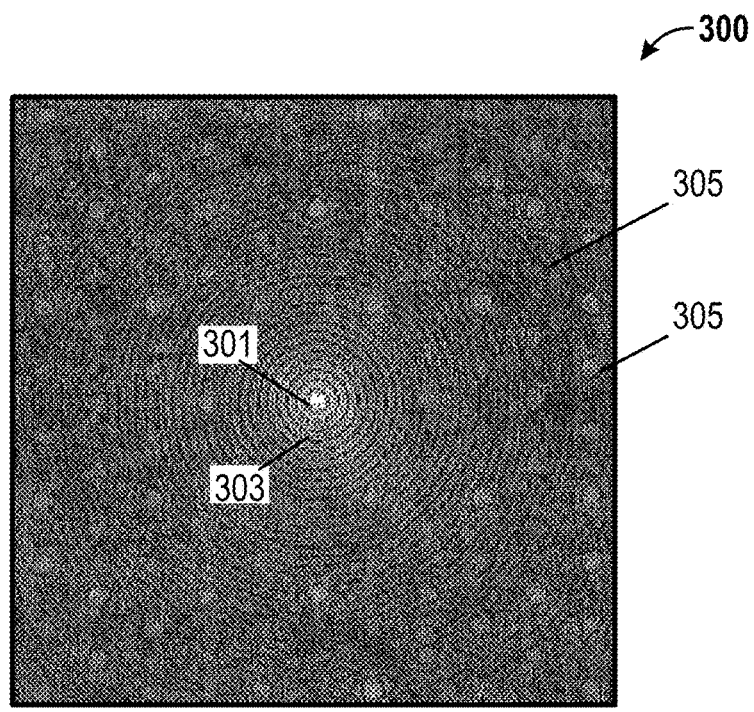
FIG. 3 (Prior Art) shows an exemplary diffraction pattern related to use of the metallic coating having the pattern shown in FIG. 2.

FIG. 2 shows an exemplary pattern 200 of a metallic coating that may be used to block electromagnetic interference in a conventional EMI shield. The exemplary pattern 200 includes a hub-spoke pattern that includes a plurality of apertures (the hubs) 201 forming a periodic pattern. The hubs 201 are connected by various spokes 203. The hubs 201 and the spokes 203 therefore define a grid which, in the case of the pattern 200, is laid out in a hexagonal pattern. The hubs 201 and spokes 203 may be made of a metallic substance that is suitable for conducting charge through the pattern in response to EMI. When light passes through the grid pattern, the light experiences diffraction from the hubs 201 as well as from the spokes 203. FIG. 3 shows an image formed in an image plane for a light beam passing through the exemplary metallic pattern 200. The image produces a bright central beam 301 surrounded by diffractive rings 303. Side lobes 305 are evident in the image 300. The side lobes 305 are formed at substantially periodic locations with respect to the bright central beam 301. The presence of the side lobes 305 and their periodicity are a result of constructive interference of light passing through the plurality of apertures 201. Due to the periodic nature of the pattern 200, the phases of light at a selected side lobe are related by an integral number of wavelengths of the light. Thus, the light constructively interferes at the location of the side lobes 305, thereby leading to their appearance in the image 300.

Figure 4:
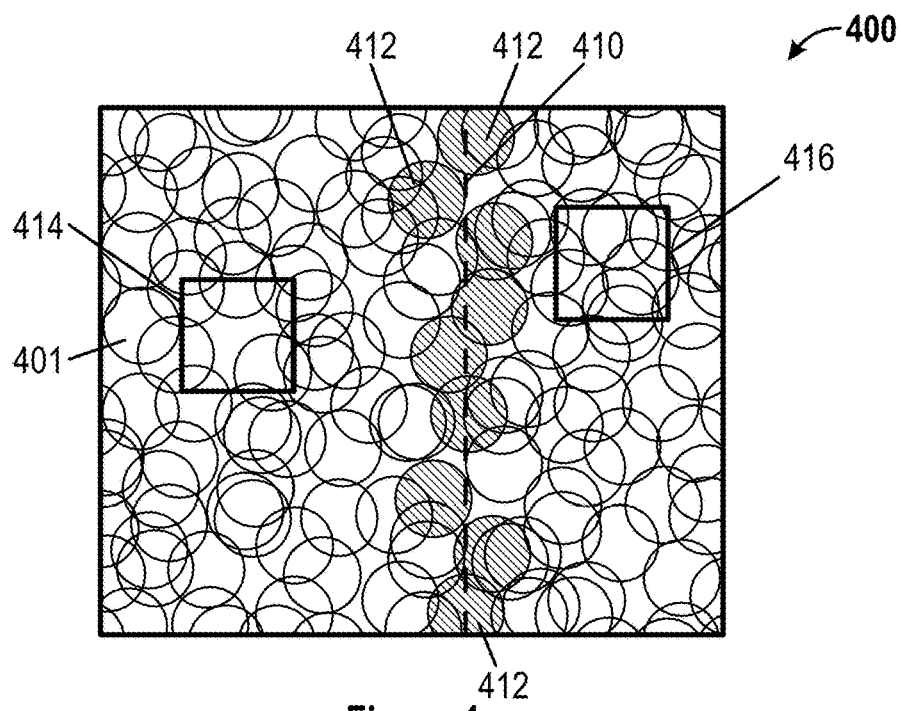
FIG. 4 (Prior Art) shows another grid pattern 400 used in metallic coating for conventional EMI shields.
Figure 5:
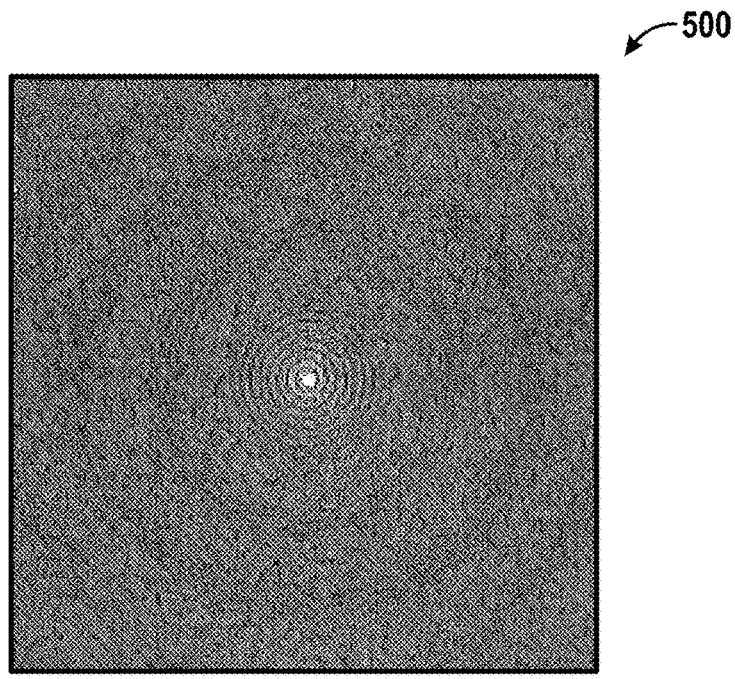
FIG. 5 (Prior Art) shows an exemplary diffraction pattern related to use of metallic coating having the pattern shown in FIG. 4.

FIG. 4 shows another grid pattern 400 used in metallic coating for conventional EMI shields. The grid pattern 400 reduces an appearance of side lobes formed in the diffraction at optical wavelengths while preventing the transmission of EMI. The grid pattern 400 includes a plurality of apertures 401 that are placed at random locations in the grid pattern 400. The random placement of the apertures 401 produces a random or uncorrelated relation between phases of light diffracted from each of the apertures, at the related image plane 500 (see FIG. 5). Since the phases of light are uncorrelated, there is an overall destructive interference in the light at the locations of the side lobe resulting in the disappearance or absence of side lobes, as shown by the absence of side lobes in image plane 500.

FIG. 4 further shows various elements that are not part of the pattern 400 when the coating is manufactured, but which are shown for explanatory purposes to discuss various aspect of the pattern 400. These explanatory elements include the vertical line 410, the shading of selected apertures 412, and the square areas 414 and 416. The vertical line 410 and shaded apertures 412 illustrate the random or uncorrelated relation of the apertures. The shaded apertures are those apertures that are substantially contacted by the vertical line 410. Light that falls along the vertical line may have a certain correlated phase relation. The centers of each of the shaded apertures 412 may be a determinable perpendicular distance from vertical line 410. The distribution of these distances is random and thus uncorrelated. Since their relative distances are uncorrelated, light diffracted by each of the shaded apertures 412 have random and uncorrelated phases with respect to each other. This uncorrelated phase relation produces substantially destructive interference anywhere in the related image plane—including where side lobes would have formed had the grid pattern not been favorably arranged in accordance with this disclosure—thereby reducing the appearance of side lobes.

Squares 414 and 416 are shown to illustrate a granular metal density of a coating having the aperture pattern 400. The granular metal density is related to a local conductivity of the coating. This local conductivity varies across the grid as a result of the random placement of apertures 401 in pattern 400. For a selected square, a granular metal density may be determined by measuring the lengths of the sum of aperture segments within in a selected square. Square 414 and square 416 have the same dimensions. It is clear that the metal density in square 414 is less than the metal density in square 416. This difference in metal density is evident in the relative semi-transparency of the grid in square 414 in comparison to the relative opacity of the grid in square 416. In fact, the granular metal density is unevenly distributed over the pattern 400. Thus, the electrical conductivity or the ability of the random pattern 400 to shield circuitry from electromagnetic pulses is weaker in the area defined by square 414 than it is in the area defined by square 416. Thus, random placement of the apertures produces a metallic coating that, although reducing the presence of side lobes in image 500, has potentially uneven EMI shielding abilities.

Figure 6:
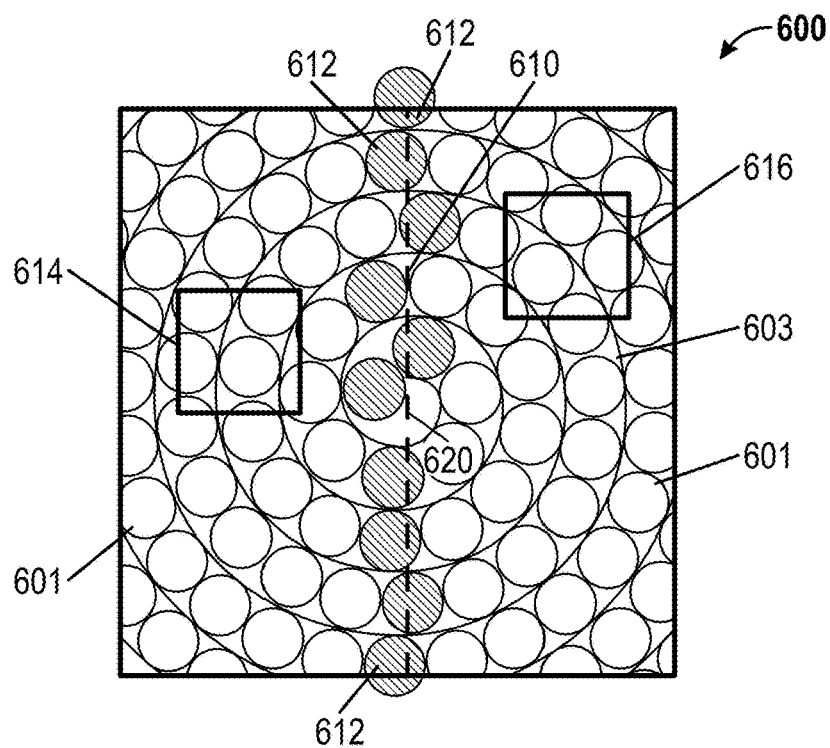
FIG. 6 shows an exemplary pattern of a metallic coating of the present disclosure.
Figure 7:
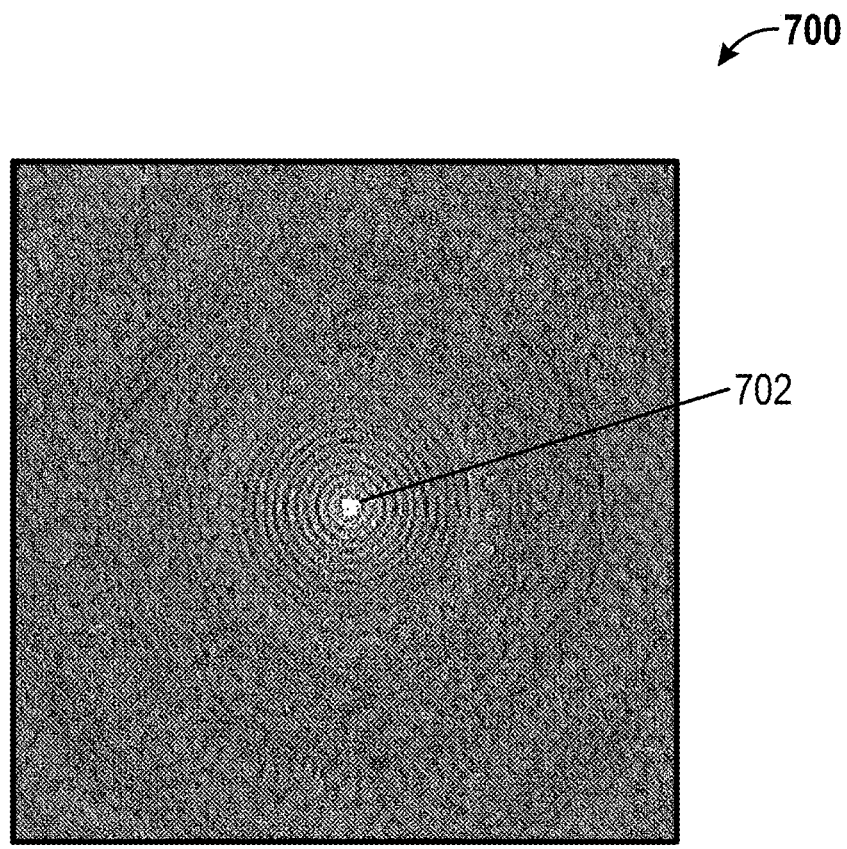
FIG. 7 shows an exemplary diffraction pattern related to use of metallic coating having the pattern shown in FIG. 6.

FIG. 6 shows an exemplary pattern 600 of a metallic coating of the present disclosure. The exemplary grid pattern 600 includes a grid layout created using a deterministic algorithm and that produces a pattern that nonetheless produces a random or uncorrelated relation between the locations of the apertures 601 within the pattern. As a result, a laser beam or light beam passing through the exemplary grid pattern 60 produces a single central lobe 702 (see FIG. 7) while reducing the presence of side lobes. At the same time, a metal density of the grid pattern is substantially the same for any selected grain size or square area of the grid. The exemplary pattern 600 is formed from an Archimedes spiral 603, which is mathematically described using the following equation:

$$s = a + b\theta \qquad \text{Eq. (1)}$$

where s is the spiral curve 603, a is an angular offset of the pattern 620 of the spiral 603, b is a scalar dimension of the spiral equal to the distance between the turns of the spiral 603 and $\theta$ is the angle parameter of the spiral 603. These pattern parameters of Eq. (1) can be selected by a designer to fit a selected criterion or multiple selected criteria. In an exemplary embodiment, circles 601, which form apertures of the pattern 600, are placed in the Archimedes spiral 603. A first circle is placed in the spiral starting at a place nearest the origin 620 of the spiral 603. Each subsequent circle is placed in the spiral 602 adjacent the previous circle so that the boundaries of the circles make contact at a substantially single point, i.e., the boundaries of the circles are in contact without overlapping of the circles. A selected circle is in contact with the spiral 603 at two substantially diametrically opposed locations. This process of adding apertures may be continued to produce the exemplary pattern 600. The pattern 600 formed from using this deterministic method has neither translational symmetry nor rotational symmetry. Additionally, the phase relation between the circles 601 are uncorrelated, leading to an uncorrelated phase relation at side lobes of the image, as discussed below.

In the exemplary pattern 600, various elements are shown that are not part of the pattern 600 when the coating is manufactured, but which are shown for explanatory purposes to discuss various aspect of the pattern 600. These explanatory elements include the vertical line 610, the shading of selected apertures 612, and the square areas 614 and 616. The vertical line 610 and shaded apertures 612 illustrate the random or uncorrelated relation of the apertures. The apertures fall along a non-periodic "lattice." Additionally, each aperture is separated by a distance from an observation point in an associated image plane. The plurality of these distances associated with the plurality of apertures within the pattern is uncorrelated. The perpendicular distances between the centers of the shaded apertures 612 and the vertical line 410 are uncorrelated although there placement is a result of a deterministic placement method rather than a random placement method. As a result, the phase relation of light are uncorrelated at the side lobes in the image plane (see image plane 700 of FIG. 7), resulting in an overall destructive interference of the light at the side lobes and the subsequent disappearance of the side lobes. Also shown in FIG. 6, two squares 614 and 616 are used to determine a granular metal density of the pattern 600. It is evident that the density of circles through the pattern is relatively constant. Therefore, the granular metal density in square 614 is approximately the same as the granular metal density in square 616. Thus, the deterministic method of producing the exemplary pattern 600 of the present disclosure provides an even distribution of metal density through the grid. This leads to an even conductance at all parts of a metallic coating that employs the exemplary pattern 600, thereby providing even shielding from EMI.

In alternate embodiment of the present disclosure, the pattern 600 may include a second spiral that passes through the centers of the circles 601. In another embodiment, the spiral 603 may be filled with half-circles. The half-circle embodiment may be suitable to allow simple adjustments of surface resistance of the metal coating by changing a spacing between the semicircles. The embodiment using semicircles allows for adjustments of a halo irradiance by scaling the entire pattern, while maintaining resistivity by scaling the relative half-circle spacing along the spiral. In another embodiment, the spiral connecting the edges of the circles may be dispensed with by using circles that are larger in diameter than the spacing of the individual turns of the spiral ('b' of Equation 1), thereby causing the circles to overlap those in adjacent turns of the spiral. In other embodiments, the shape of the aperture may be non-circular, i.e., elliptical, polygonal, etc. While the Archimedes spiral 603 is used as an illustrative example, any algebraically deterministic curve that organizes apertures in a pattern wherein the distance of each of the apertures to any given point in the associated image space is random or uncorrelated may be used in other embodiments of the disclosure.

In other aspects of the present disclosure, the use of an algebraically deterministic coating pattern allows a designer to change one or more parameters of the grid pattern to increase or decrease the ability of the resultant coating to protect from EMI, while maintaining the ability of the resultant coating to reduce the appearance of side lobes in an image plane. Changing the ability of the coating to protect from EMI requires changing the electrical resistance of the grid, which requires changing the relative area of the substrate being covered by the grid pattern. For example, if the overall pattern is scaled by changing the value of 'b' in Equation 1, but the width of the metal lines making up the pattern are not scaled, then the relative area covered by the pattern will change by that overall scale factor. The fractional area covered by the pattern represents a blocking obscuration to incident optical light. Thus, the designer may design a pattern that trades off EMI protection for optical transmittance, while maintaining side lobe reduction. In addition, a manufacture of the coating may be controlled by selection of pattern parameters, thereby streamlining the manufacturing process. By naming the value of the width of the metal line, the diameter of the circle (aperture), the value of 'b' in Equation 1, and the location of the spiral origin on the optical substrate, the entire grid pattern may be specified for the manufacturing process, and its expected performance may be determined, both in terms of EMI performance and optical performance.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated While the exemplary embodiment to the disclosure has been described, it will be understood that those skilled in the art, both now and in the future, may make various improvements and enhancements which fall within the scope of the claims which follow. These claims should be construed to maintain the proper protection for the disclosure first described.

What is claimed is:

1. A method of shielding an object from an electromagnetic signal, comprising:
   forming a metallic coating characterized by a plurality of apertures aligned in a pattern that is defined by a deterministic relation, wherein distances between each of the plurality of apertures and an observation point in an associated image plane are uncorrelated and the pattern is formed as an Archimedes spiral of the plurality of apertures; and
   placing the metallic coating between the object and the electromagnetic signal.

2. The method of claim 1, further comprising selecting a parameter of the metallic coating to control at least one of: (i) an electrical property of the metallic coating; and (ii) an optical property of the metallic coating.

3. The method of claim 1, wherein the alignment of the plurality of apertures in the pattern provides a substantially uniform average distribution of metal in the metallic coating.

4. The method of claim 1, wherein the pattern of the plurality of apertures in the metallic coating produces an uncorrelated phase relation of the light that is diffracted upon passing through the metal coating at an image plane of the metallic coating.

5. The method of claim 4, wherein the uncorrelated phase relation reduces generation of side lobes by light passing through the metallic mesh.

6. The method of claim 1, wherein adjacent apertures in the grid are at least one of non-overlapping and contacting each other at their boundaries.

7. A method of reducing diffraction effects in an electromagnetic interference shield, comprising:
forming the electromagnetic interference shield using a metallic coating having a plurality of apertures aligned in a pattern that is defined by a deterministic relation, wherein distances between each of the plurality of apertures and an observation point in an associated image plane are uncorrelated
wherein the deterministic relation is an Archimedes spiral.

8. The method of claim 7, wherein the pattern of the plurality of apertures in the metallic coating produces an uncorrelated phase relation of light passing through the metal coating at an image plane of the metallic coating.

9. The method of claim 8, wherein the uncorrelated phase relation reduces generation of side lobes at the image plane.

\* \* \* \* \*